(12) United States Patent
Xu et al.

(10) Patent No.: US 11,244,994 B2
(45) Date of Patent: Feb. 8, 2022

(54) THIN FILM TRANSISTOR ARRAY SUBSTRATE AND ORGANIC LIGHT EMITTING DIODE PANEL

(71) Applicant: WUHAN CHINA STAR OPTOELECTRONICS SEMICONDUCTOR DISPLAY TECHNOLOGY CO., LTD., Hubei (CN)

(72) Inventors: Bin Xu, Hubei (CN); Hongyu Xu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/650,873

(22) PCT Filed: Dec. 25, 2019

(86) PCT No.: PCT/CN2019/128228
§ 371 (c)(1),
(2) Date: Mar. 26, 2020

(87) PCT Pub. No.: WO2021/077605
PCT Pub. Date: Apr. 29, 2021

(65) Prior Publication Data
US 2021/0126067 A1    Apr. 29, 2021

(30) Foreign Application Priority Data
Oct. 23, 2019  (CN) .......................... 201911014003

(51) Int. Cl.
*H01L 27/32* (2006.01)
*H01L 51/00* (2006.01)
*H01L 51/52* (2006.01)

(52) U.S. Cl.
CPC ...... *H01L 27/3253* (2013.01); *H01L 27/3262* (2013.01); *H01L 51/0097* (2013.01); *H01L 51/5253* (2013.01)

(58) Field of Classification Search
CPC ............ H01L 27/3253; H01L 27/3262; H01L 51/0097; H01L 51/5253
See application file for complete search history.

(56) References Cited

U.S. PATENT DOCUMENTS

| 6,501,096 B1* | 12/2002 | Hashimoto | ....... G02F 1/136209 257/59 |
| 8,309,379 B2* | 11/2012 | Park | ..................... H01L 27/1266 438/34 |

(Continued)

FOREIGN PATENT DOCUMENTS

| CN | 106773424 A | 5/2017 |
| CN | 109148529 A | 1/2019 |
| CN | 109326628 A | 2/2019 |

*Primary Examiner* — Ida M Soward
(74) *Attorney, Agent, or Firm* — Mark M. Friedman

(57) ABSTRACT

A thin film transistor (TFT) array substrate and an organic light emitting diode (OLED) panel are provided. The TFT array substrate includes a display area and a non-display area. The non-display area is provided with a plurality of gate traces connected to a control chip, the TFT array substrate includes: a flexible substrate includes a metal jumper-joint sublayer disposed in the non-display area, wherein the metal jumper-joint sublayer is adjacent to the display area; and a thin film transistor is disposed on the flexible substrate, wherein the thin film transistor layer includes a plurality of thin film transistors correspondingly disposed in the display area, and a gate trace of each of the (Continued)

thin film transistors and the gate trace of the non-display area are connected by a jumper joint arrangement through the metal jumper-joint sublayer.

17 Claims, 3 Drawing Sheets

(56) References Cited

U.S. PATENT DOCUMENTS

| | | | | |
|---|---|---|---|---|
| 9,608,049 | B2* | 3/2017 | Lee | H01L 51/0097 |
| 10,045,445 | B2* | 8/2018 | Liu | H05K 5/0017 |
| 10,230,063 | B2* | 3/2019 | Jang | B32B 15/09 |
| 10,541,293 | B2* | 1/2020 | Kim | H01L 51/5237 |
| 10,636,863 | B2* | 4/2020 | Kim | H01L 27/3258 |
| 10,761,354 | B2* | 9/2020 | Hanada | G02F 1/1368 |
| 10,790,317 | B2* | 9/2020 | Wang | H01L 27/156 |
| 10,840,478 | B2* | 11/2020 | Han | H01L 27/3262 |
| 10,861,919 | B2* | 12/2020 | Ding | H01L 27/3246 |
| 10,862,068 | B2* | 12/2020 | Choi | H01L 51/5253 |
| 10,873,053 | B2* | 12/2020 | Sung | H01L 21/76205 |
| 10,910,592 | B2* | 2/2021 | Kuon | H01L 51/0097 |
| 10,916,588 | B2* | 2/2021 | Kang | H01L 27/3258 |
| 10,923,511 | B2* | 2/2021 | Hu | H01L 27/1218 |
| 10,930,721 | B2* | 2/2021 | Yang | H01L 21/469 |
| 10,964,913 | B2* | 3/2021 | Moon | H01L 51/5253 |
| 10,978,652 | B2* | 4/2021 | Wu | H01L 51/5253 |
| 2004/0245525 | A1* | 12/2004 | Yamazaki | G07F 7/1008 |
| | | | | 257/66 |
| 2016/0043160 | A1 | 2/2016 | Cho et al. | |
| 2019/0131377 | A1* | 5/2019 | Kwon | H01L 51/524 |
| 2020/0161582 | A1* | 5/2020 | Choi | H01L 27/326 |
| 2021/0111374 | A1* | 4/2021 | Sung | H01L 51/0097 |
| 2021/0242299 | A1* | 8/2021 | Saeki | G09F 9/00 |

* cited by examiner

THIN FILM TRANSISTOR ARRAY SUBSTRATE AND ORGANIC LIGHT EMITTING DIODE PANEL

FIELD OF INVENTION

The present disclosure relates to the field of display technologies, and more particularly, to a thin film transistor (TFT) array substrate and an organic light emitting diode (OLED) panel.

BACKGROUND OF INVENTION

Organic light emitting diodes (OLEDs) have many excellent features such as self-emission, low energy consumption, wide viewing angles, rich colors, fast response times, and the ability to prepare flexible screens. The related designs used in the display have already become the main trend in the field of display technologies. Wherein, reducing the length of the non-display area of an OLED panel is one of the main issues.

Technical Problems

In the design of the existing OLED panel, as shown in FIG. 1, scan lines, data lines, and ground lines of a thin film transistor (TFT) array in the display area 2 are respectively connected to a chip on film (COF) by gate traces 3 (including a connecting area 31 and a fan-out area 32), VDD traces 4, and VSS traces 5. Because the gate traces are located in the gate metal layer, and the VDD traces 4 and the VSS traces 5 are located in a source/drain layer, the gate traces 3 are jumper-jointed to the source/drain layer at a jumper-joint position 33, i.e. a jumper joint arrangement, to facilitate the subsequent connection steps. However, in order to prevent various traces from contacting each other, the jumper-joint position 33 needs to avoid the positions of the VDD traces 4 and the positions of the VSS traces 5. Thus, the length of the lower bezel of the OLED panel cannot be further reduced.

Therefore, it is necessary to provide a thin film transistor (TFT) array substrate and an organic light emitting diode (OLED) panel to solve the problems of the prior art.

SUMMARY OF INVENTION

Technical Solutions

The object of the present disclosure is to provide a thin film transistor (TFT) array substrate and an organic light emitting diode (OLED) panel. The present disclosure can avoid the problem of the existing technology and further reduce the length of lower bezel of the OLED panel, thereby forming an OLED panel with a narrow bezel.

In order to achieve the aforementioned object of the present disclosure, the present disclosure provides an organic light emitting diode (OLED) panel, including:

a thin film transistor (TFT) array substrate including a display area and a non-display area, wherein the non-display area is provided with a plurality of gate traces connected to a control chip, the TFT array substrate includes a flexible substrate and a thin film transistor layer, the flexible substrate includes a metal jumper-joint sublayer disposed in the non-display area, the metal jumper-joint sublayer is adjacent to the display area, the thin film transistor layer is disposed on the flexible substrate, and the thin film transistor layer includes a plurality of thin film transistors correspondingly disposed in the display area, a gate trace of each of the thin film transistors and a gate trace of the non-display area are connected by a jumper joint arrangement through the metal jumper-joint sublayer, the flexible substrate includes a first flexible sublayer, an inorganic sublayer, the metal jumper-joint sublayer, and a second flexible sublayer stacked in sequence;

a planarization layer is disposed on the thin film transistor layer;

a pixel definition layer is disposed on the planarization layer;

an organic electroluminescent device layer is disposed on the pixel definition layer and located in the display area; and an encapsulation layer is disposed on the organic electroluminescent device layer.

According to one embodiment of the present disclosure, the metal jumper-joint sublayer includes a first titanium metal sublayer, an aluminum metal sublayer, and a second titanium metal sublayer stacked in sequence.

According to one embodiment of the present disclosure, the metal jumper-joint sublayer is correspondingly disposed in a bending area of the non-display area.

According to one embodiment of the present disclosure, the second flexible sublayer is provided with a first through hole and a second through hole, the first through hole is used for connecting the gate trace of the thin film transistor to the metal jumper-joint sublayer, and the second through hole is used for connecting the gate trace of the non-display area to the metal jumper-joint sublayer.

According to one embodiment of the present disclosure, the thin film transistor layer includes a TFT active area, a gate insulation sublayer, the gate traces, an interlayer dielectric sublayer, and a plurality of source/drain traces stacked in sequence, the gate insulation sublayer is provided with a third through hole at a position corresponding to the metal jumper-joint sublayer, and the third through hole is used for connecting the gate trace of the thin film transistor to the metal jumper-joint sublayer.

According to one embodiment of the present disclosure, the TFT array substrate further includes a buffer layer disposed between the flexible substrate and the thin film transistor layer, the buffer layer is provided with a fourth through hole at a position corresponding to the metal jumper-joint sublayer, and the fourth through hole is used for connecting the gate trace of the thin film transistor to the metal jumper-joint sublayer.

According to one embodiment of the present disclosure, the encapsulation layer includes a first inorganic encapsulation layer, an organic encapsulation layer, and a second inorganic encapsulation layer.

The present disclosure further provides a thin film transistor (TFT) array substrate, including a display area and a non-display area, wherein the non-display area is provided with a plurality of gate traces connected to a control chip, the TFT array substrate includes:

a flexible substrate includes a metal jumper-joint sublayer disposed in the non-display area, the metal jumper-joint sublayer adjacent to the display area; and a thin film transistor layer is disposed on the flexible substrate, and the thin film transistor layer includes a plurality of thin film transistors correspondingly disposed in the display area, a gate trace of each of the thin film transistors and a gate trace of the non-display area are connected by a jumper joint arrangement through the metal jumper-joint sublayer.

According to one embodiment of the present disclosure, the flexible substrate includes a first flexible sublayer, an inorganic sublayer, the metal jumper-joint sublayer, and a second flexible sublayer stacked in sequence.

According to one embodiment of the present disclosure, the metal jumper-joint sublayer includes a first titanium metal sublayer, an aluminum metal sublayer, and a second titanium metal sublayer stacked in sequence.

According to one embodiment of the present disclosure, the metal jumper-joint sublayer is correspondingly disposed in a bending area of the non-display area.

According to one embodiment of the present disclosure, the second flexible sublayer is provided with a first through hole and a second through hole, the first through hole is used for connecting the gate trace of the thin film transistor to the metal jumper-joint sublayer, and the second through hole is used for connecting the gate trace of the non-display area to the metal jumper-joint sublayer.

According to one embodiment of the present disclosure, the thin film transistor layer includes a TFT active area, a gate insulation sublayer, the gate traces, an interlayer dielectric sublayer, and a plurality of source/drain traces stacked in sequence, the gate insulation sublayer is provided with a third through hole at a position corresponding to the metal jumper-joint sublayer, and the third through hole is used for connecting the gate trace of the thin film transistor to the metal jumper-joint sublayer.

According to one embodiment of the present disclosure, the TFT array substrate further includes a buffer layer disposed between the flexible substrate and the thin film transistor layer, the buffer layer is provided with a fourth through hole at a position corresponding to the metal jumper-joint sublayer, and the fourth through hole is used for connecting the gate trace of the thin film transistor to the metal jumper-joint sublayer.

The present disclosure further provides an organic light emitting diode (OLED) panel, including:

a thin film transistor (TFT) array substrate including a display area and a non-display area, wherein the non-display area is provided with a plurality of gate traces connected to a control chip, the TFT array substrate includes a flexible substrate and a thin film transistor layer, the flexible substrate includes a metal jumper-joint sublayer disposed in the non-display area, the metal jumper-joint sublayer is adjacent to the display area, the thin film transistor layer is disposed on the flexible substrate, and the thin film transistor layer includes a plurality of thin film transistors correspondingly disposed in the display area, a gate trace of each of the thin film transistors and a gate trace of the non-display area are connected by a jumper joint arrangement through the metal jumper-joint sublayer;

an organic electroluminescent device layer is disposed on the thin film transistor layer and located in the display area; and an encapsulation layer is disposed on the organic electroluminescent device layer.

According to one embodiment of the present disclosure, the flexible substrate includes a first flexible sublayer, an inorganic sublayer, the metal jumper-joint sublayer, and a second flexible sublayer stacked in sequence.

According to one embodiment of the present disclosure, the metal jumper-joint sublayer is correspondingly disposed in a bending area of the non-display area.

Beneficial Effect

Since the gate trace of each of the thin film transistors and the gate trace of the non-display area are connected by a jumper joint arrangement through the metal jumper-joint sublayer, the metal jumper-joint sublayer can be disposed in the bending area to prevent the gate trace from breaks upon being bent, thereby reducing the length of the lower bezel of the OLED panel.

DESCRIPTION OF DRAWINGS

In order to make the above content of the present disclosure more comprehensible, the preferred embodiments are described as follows in detail with the accompanying drawings.

DETAILED DESCRIPTION OF PREFERRED EMBODIMENTS

In the following detailed description of the preferred embodiments, reference is made to the accompanying drawings which form a part hereof, and in which is shown by way of illustrating specific embodiments in which the disclosure may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting.

Figure 2:
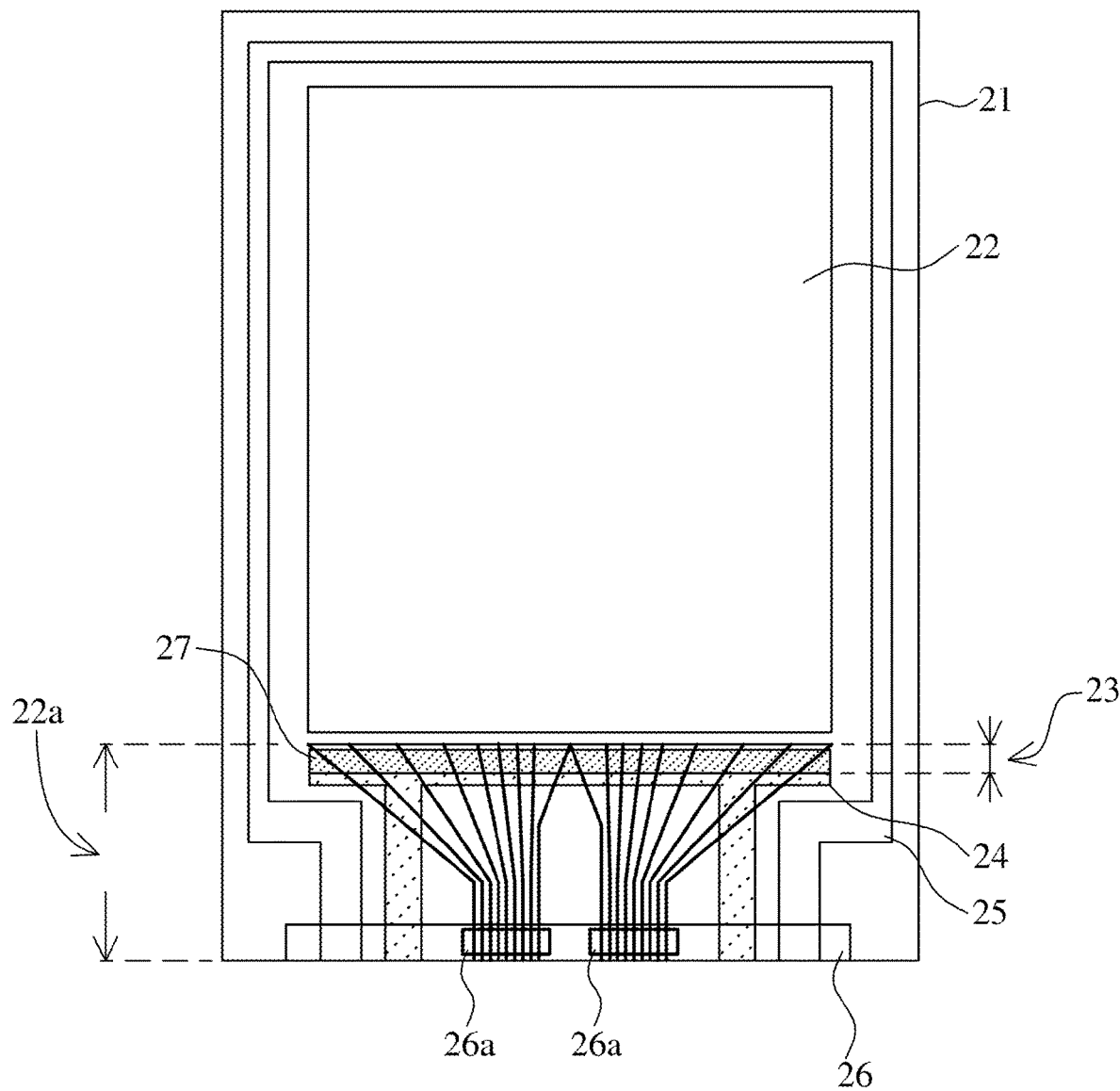
FIG. 2 is a schematic diagram of a circuit configuration of an OLED panel according to one embodiment of the present disclosure.
Figure 3:
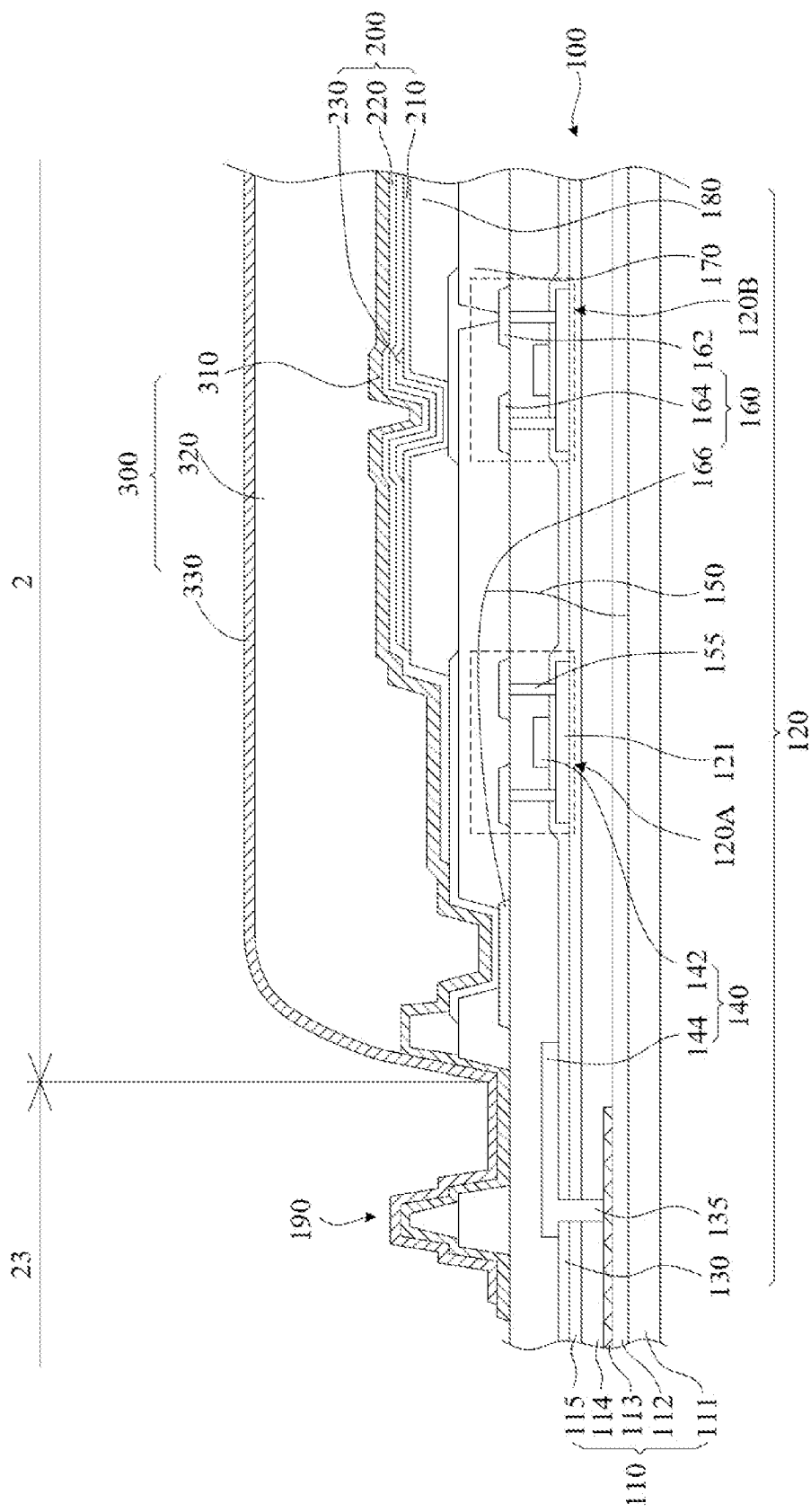
FIG. 3 is a structural cross-section view of the embodiment in FIG. 2.

Please refer to FIG. 2 and FIG. 3. FIG. 2 is a schematic diagram of a circuit configuration of an OLED panel according to one embodiment of the present disclosure. FIG. 3 is a structural cross-section view of the embodiment in FIG. 2. An OLED panel of the embodiment includes a thin film transistor (TFT) array substrate 100, an organic electroluminescent device layer 200, and an encapsulation layer 300. The organic electroluminescent device layer 200 is disposed on the TFT array substrate 100, and the encapsulation layer 300 is disposed on the organic electroluminescent device layer 200.

As shown in FIG. 2, the TFT array substrate 100 includes a bezel 21, a display area 22, and a non-display area 22a. The non-display area 22a is provided with a plurality of gate traces connected to a control chip 26a. Taking FIG. 2 as an example, the non-display area 22a may include a bending area 23, and the non-display area 22a may further include an interface area 26 for connecting to the control chip 26a, VDD traces 24, and VSS traces 25.

As shown in FIG. 3, the TFT array substrate 100 includes a flexible substrate 110 and a thin film transistor layer 120. The flexible substrate 110 includes a first flexible sublayer 111, an inorganic sublayer 112, a metal jumper-joint sublayer 113, and a second flexible sublayer 114 stacked in sequence. The first flexible sublayer 111 and the second flexible sublayer 114 may be made of flexible polymer materials, such as polyimide (PI). The metal jumper-joint sublayer 113 is disposed in the bending area 23 of the non-display area 22a, and the metal jumper-joint sublayer 113 is adjacent to the display area 2. In addition, the metal jumper-joint sublayer 113 includes a first titanium metal sublayer, an aluminum metal sublayer, and a second titanium metal sublayer stacked in sequence. The structure using titanium metal/aluminum metal/titanium metal has a desirable ductility, so that the metal jumper-joint sublayer 113 is easily bent, thereby further reducing the lower bezel of the OLED panel. The second flexible sublayer 114 is provided with a first through hole and a second through hole, the first through hole is used for connecting the gate trace 142 of the thin film transistor to the metal jumper-joint sublayer 113, and the second through hole is used for connecting the gate trace 144 of the non-display area 22a to the metal jumper-joint sublayer 113.

The thin film transistor layer 120 is disposed on the flexible substrate 110, and the thin film transistor layer 120 includes a plurality of thin film transistors 120A, 120B correspondingly disposed in the display area, wherein a gate trace of each of the thin film transistors 120A, 120B and the gate trace 144 of the non-display area 22a are connected by a jumper joint arrangement through the metal jumper-joint sublayer 113.

The thin film transistor layer 120 includes a TFT active area 121, a gate insulation sublayer 130, the gate traces 142, an interlayer dielectric sublayer 150, and a source/drain layer 160 stacked in sequence, the gate insulation sublayer 130 is provided with a third through hole at a position corresponding to the metal jumper-joint sublayer 113, and the third through hole is used for connecting the gate trace 144 of the thin film transistor to the metal jumper-joint sublayer 113.

In addition, the TFT array substrate 100 further includes a buffer layer 115 disposed between the flexible substrate 110 and the thin film transistor layer 120, the buffer layer 115 is provided with a fourth through hole at a position corresponding to the metal jumper-joint sublayer 113, and the fourth through hole is used for connecting the gate trace 144 of the thin film transistor to the metal jumper-joint sublayer 113.

The organic electroluminescent device layer 200 is disposed on the thin film transistor layer 110 and located in the display area 2. The organic electroluminescent device layer 200 includes a first electrode 210, a second electrode 220, and an electroluminescent layer 230, wherein the electroluminescent layer 230 is disposed between the first electrode 210 and the second electrode 220.

The encapsulation layer 300 is disposed on the organic electroluminescent device layer 200. The encapsulation layer 300 includes a first inorganic encapsulation layer 310, an organic encapsulation layer 320, and a second inorganic encapsulation layer 330.

Taking FIG. 3 as an example to explain in more detail, the inorganic sublayer 112 is disposed on the first flexible sublayer 111. The metal jumper-joint sublayer 113 is disposed on the inorganic sublayer 112, and the metal jumper-joint sublayer 113 is disposed in the bending area 23 of the non-display area 22a (that is, the jumper-joint position 27 in FIG. 2). The second flexible sublayer 114 is disposed on the metal jumper-joint sublayer 113 and the inorganic sublayer 112. The buffer layer 115 is disposed on the second flexible sublayer 114.

The thin film transistor layer 120 is disposed on the buffer layer 115. The interlayer dielectric sublayer 150 of the thin film transistor layer 120 is disposed between a gate metal layer 140 and the source/drain layer 160. The gate metal layer 140 includes at least one gate electrode 142 and at least one gate traces 144 in the non-display area 22a. The gate electrode 142 is located in the display area 2. The gate trace 144 is connected to the gate traces in the display area (not shown). The gate trace of the display area is electrically connected to the metal jumper-joint sublayer 113 through a conductive via 135 before the gate trace of the display area enters the bending area 23. The metal jumper-joint sublayer 113 is electrically connected to the gate trace 144 in the non-display area 22a through a conductive via (not shown) after passing through the bending area 23. In this way, when the gate trace passes through the bending region 23, the metal jumper-joint sublayer 113 with desirable bending performance is used to achieve electrical connection, to prevent the gate trace form breaks when the bending region 23 is bent. The conductive via 135 may be formed by the second through hole, the third through hole, and the fourth through hole. That is, the conductive via 135 is formed by depositing metal in the second through hole, the third through hole, and the fourth through hole, which are corresponding to each other. The source/drain layer 160 includes at least one source electrode 160, at least one drain electrode 164, and at least one source/drain trace 166. The source electrode 162, the drain electrode 164, and the corresponding gate electrode 142 are connected through an interlayer dielectric sublayer conductive hole 155 to form the thin film transistor (such as, 120A, 120B). The thin film transistor 120A, 120B are located in the display area 2.

In addition, a planarization layer 170 and a pixel definition layer 180 may be provided between the thin film transistor layer 110 and the organic electroluminescent device layer 200. The planarization layer 170 is disposed on the source/drain layer 160. The pixel definition layer 180 is disposed on the planarization layer 170.

Figure 1:
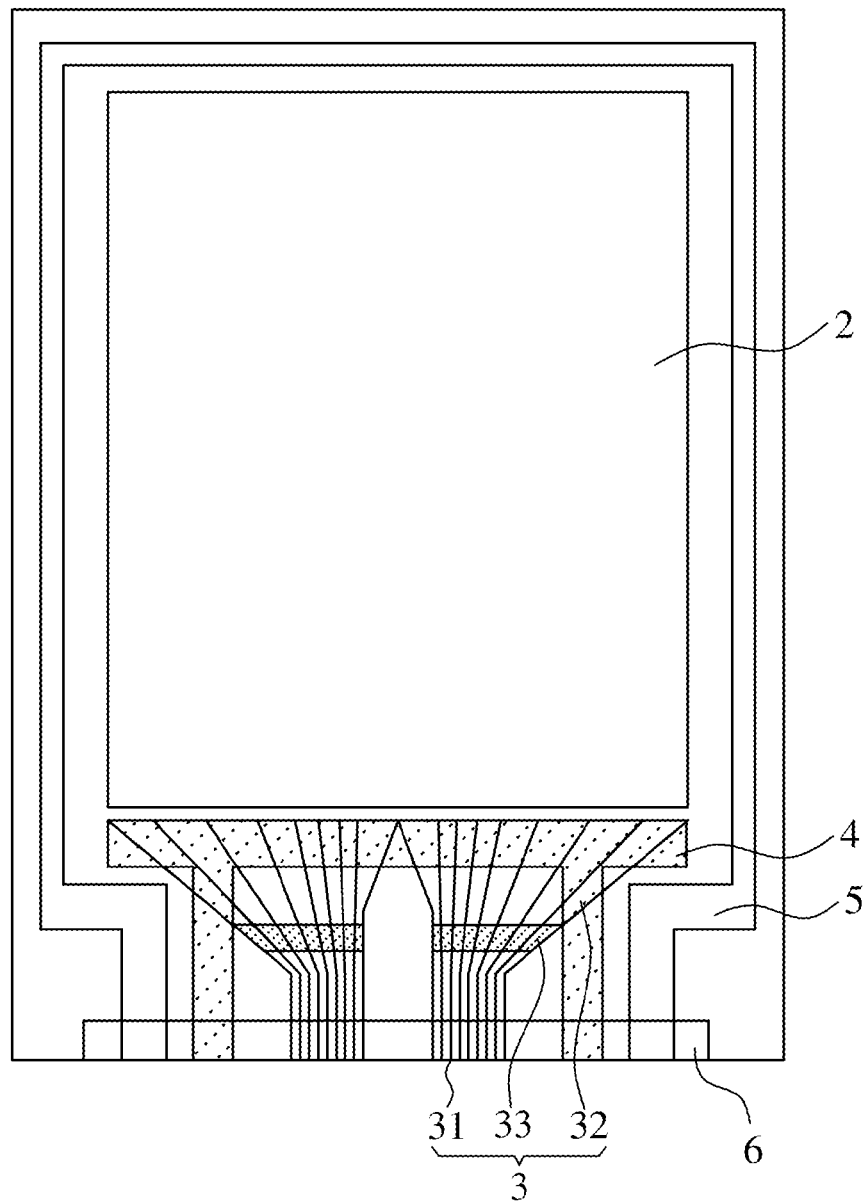
FIG. 1 is a schematic diagram of a circuit configuration of an existing organic light emitting diode (OLED) panel.

Due to the gate traces are connected by a jumper joint arrangement through the metal jumper-joint sublayer, the jumper-joint position 27 in the embodiment of the present disclosure can be located adjacent to the display area 22 (please refer to FIG. 1 and FIG. 2). Therefore, the present disclosure can further reduce the length of the lower bezel of the OLED panel.

Furthermore, the OLED panel further includes a retaining wall 190 located in the non-display area 22a. The retaining wall 190 is formed by the planarization layer 170 and the pixel definition layer 180. The retaining wall 190 may further includes the first inorganic encapsulation layer 310 and the second inorganic encapsulation layer 330 stacked in sequence.

The beneficial effect of the present disclosure is described as follow. Since the gate trace of each of the thin film transistors and the gate trace of the non-display area 22a are connected by the jumper joint arrangement through the metal jumper-joint sublayer, the metal jumper-joint sublayer can be disposed in the bending area to prevent the gate trace from breaks upon being bent, thereby reducing the length of the lower bezel of the OLED panel.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. An organic light emitting diode (OLED) panel, comprising:
   a thin film transistor (TFT) array substrate comprising a display area and a non-display area, wherein the non-display area is provided with a plurality of gate traces connected to a control chip, the TFT array substrate includes a flexible substrate and a thin film transistor layer, the flexible substrate includes a metal jumper-joint sublayer disposed in the non-display area, the metal jumper-joint sublayer is adjacent to the display area, the thin film transistor layer is disposed on the flexible substrate, and the thin film transistor layer includes a plurality of thin film transistors correspondingly disposed in the display area, a gate trace of each of the thin film transistors and a gate trace of the non-display area are connected by a jumper joint arrangement through the metal jumper-joint sublayer, the flexible substrate includes a first flexible sublayer, an inorganic sublayer, the metal jumper-joint sublayer, and a second flexible sublayer stacked in sequence;

a planarization layer is disposed on the thin film transistor layer;

a pixel definition layer is disposed on the planarization layer;

an organic electroluminescent device layer is disposed on the pixel definition layer and located in the display area; and an encapsulation layer is disposed on the organic electroluminescent device layer.

2. The OLED panel according to claim 1, wherein the metal jumper-joint sublayer comprises a first titanium metal sublayer, an aluminum metal sublayer, and a second titanium metal sublayer stacked in sequence.

3. The OLED panel according to claim 1, wherein the metal jumper-joint sublayer is correspondingly disposed in a bending area of the non-display area.

4. The OLED panel according to claim 1, wherein the second flexible sublayer is provided with a first through hole and a second through hole, the first through hole is used for connecting the gate trace of the thin film transistor to the metal jumper-joint sublayer, and the second through hole is used for connecting the gate trace of the non-display area to the metal jumper-joint sublayer.

5. The OLED panel according to claim 1, wherein the thin film transistor layer comprises a TFT active area, a gate insulation sublayer, the gate traces, an interlayer dielectric sublayer, and a plurality of source/drain traces stacked in sequence, the gate insulation sublayer is provided with a third through hole at a position corresponding to the metal jumper-joint sublayer, and the third through hole is used for connecting the gate trace of the thin film transistor to the metal jumper-joint sublayer.

6. The OLED panel according to claim 1, wherein the TFT array substrate further comprises a buffer layer disposed between the flexible substrate and the thin film transistor layer, the buffer layer is provided with a fourth through hole at a position corresponding to the metal jumper-joint sublayer, and the fourth through hole is used for connecting the gate trace of the thin film transistor to the metal jumper-joint sublayer.

7. The OLED panel according to claim 1, wherein the encapsulation layer comprises a first inorganic encapsulation layer, an organic encapsulation layer, and a second inorganic encapsulation layer.

8. A thin film transistor (TFT) array substrate, comprising a display area and a non-display area, wherein the non-display area is provided with a plurality of gate traces connected to a control chip, the TFT array substrate includes:

a flexible substrate includes a metal jumper-joint sublayer disposed in the non-display area, the metal jumper-joint sublayer adjacent to the display area; and a thin film transistor layer is disposed on the flexible substrate, and the thin film transistor layer includes a plurality of thin film transistors correspondingly disposed in the display area, a gate trace of each of the thin film transistors and a gate trace of the non-display area are connected by a jumper joint arrangement through the metal jumper-joint sublayer.

9. The TFT array substrate according to claim 8, wherein the flexible substrate comprises a first flexible sublayer, an inorganic sublayer, the metal jumper-joint sublayer, and a second flexible sublayer stacked in sequence.

10. The TFT array substrate according to claim 9, wherein the metal jumper-joint sublayer comprises a first titanium metal sublayer, an aluminum metal sublayer, and a second titanium metal sublayer stacked in sequence.

11. The TFT array substrate according to claim 9, wherein the metal jumper-joint sublayer is correspondingly disposed in a bending area of the non-display area.

12. The TFT array substrate according to claim 9, wherein the second flexible sublayer is provided with a first through hole and a second through hole, the first through hole is used for connecting the gate trace of the thin film transistor to the metal jumper-joint sublayer, and the second through hole is used for connecting the gate trace of the non-display area to the metal jumper-joint sublayer.

13. The TFT array substrate according to claim 8, wherein the thin film transistor layer comprises a TFT active area, a gate insulation sublayer, the gate traces, an interlayer dielectric sublayer, and a plurality of source/drain traces stacked in sequence, the gate insulation sublayer is provided with a third through hole at a position corresponding to the metal jumper-joint sublayer, and the third through hole is used for connecting the gate trace of the thin film transistor to the metal jumper-joint sublayer.

14. The TFT array substrate according to claim 13, wherein the TFT array substrate further comprises a buffer layer disposed between the flexible substrate and the thin film transistor layer, the buffer layer is provided with a fourth through hole at a position corresponding to the metal jumper-joint sublayer, and the fourth through hole is used for connecting the gate trace of the thin film transistor to the metal jumper-joint sublayer.

15. An organic light emitting diode (OLED) panel, comprising:

a thin film transistor (TFT) array substrate comprising a display area and a non-display area, wherein the non-display area is provided with a plurality of gate traces connected to a control chip, the TFT array substrate includes a flexible substrate and a thin film transistor layer, the flexible substrate includes a metal jumper-joint sublayer disposed in the non-display area, the metal jumper-joint sublayer is adjacent to the display area, the thin film transistor layer is disposed on the flexible substrate, and the thin film transistor layer includes a plurality of thin film transistors correspondingly disposed in the display area, a gate trace of each of the thin film transistors and a gate trace of the non-display area are connected by a jumper joint arrangement through the metal jumper-joint sublayer;

an organic electroluminescent device layer is disposed on the thin film transistor layer and located in the display area; and an encapsulation layer is disposed on the organic electroluminescent device layer.

16. The OLED panel according to claim 15, wherein the flexible substrate comprises a first flexible sublayer, an inorganic sublayer, the metal jumper-joint sublayer, and a second flexible sublayer stacked in sequence.

17. The OLED panel according to claim 16, wherein the metal jumper-joint sublayer is correspondingly disposed in a bending area of the non-display area.

* * * * *